US009087983B2

(12) United States Patent  
Guo

(10) Patent No.: US 9,087,983 B2  
(45) Date of Patent: Jul. 21, 2015

(54) SELF-ALIGNED PROCESS FOR FABRICATING VOLTAGE-GATED MRAM

(71) Applicant: Yimin Guo, San Jose, CA (US)

(72) Inventor: Yimin Guo, San Jose, CA (US)

( * ) Notice: Subject to any disclaimer, the term of this patent is extended or adjusted under 35 U.S.C. 154(b) by 26 days.

(21) Appl. No.: 14/188,699

(22) Filed: Feb. 25, 2014

(65) Prior Publication Data

US 2014/0241047 A1 Aug. 28, 2014

Related U.S. Application Data

(60) Provisional application No. 61/768,743, filed on Feb. 25, 2013.

(51) Int. Cl.  
*G11C 11/00* (2006.01)  
*H01L 43/12* (2006.01)  
*H01L 27/22* (2006.01)

(52) U.S. Cl.  
CPC .............. *H01L 43/12* (2013.01); *H01L 27/228* (2013.01)

(58) Field of Classification Search  
CPC ....................................................... G11C 11/00  
USPC ......... 365/48, 55, 62, 66, 74, 78, 80–93, 100, 365/130, 131, 148, 158, 171–173, 209, 213, 365/225.5, 230.07, 232, 243.5; 257/421, 257/E21.665; 438/3; 977/933–935  
See application file for complete search history.

(56) References Cited

U.S. PATENT DOCUMENTS

| 8,228,703 | B2 * | 7/2012 | Javerliac et al. | 365/49.17 |
| 2007/0025029 | A1 * | 2/2007 | Hayakawa et al. | 360/324.2 |
| 2008/0105938 | A1 * | 5/2008 | Ohno et al. | 257/421 |
| 2009/0096045 | A1 * | 4/2009 | Hayakawa et al. | 257/421 |
| 2010/0034014 | A1 * | 2/2010 | Ohno et al. | 365/158 |

\* cited by examiner

*Primary Examiner* — Harry W Byrne

(57) ABSTRACT

A STT-MRAM comprises apparatus and a method of manufacturing a spin-torque magnetoresistive memory and a plurality of a three-terminal magnetoresistive memory element having a voltage-gated recording. A bit line is coupled to the memory element through an upper electrode provided on the top surface of a reference layer, a select CMOS is coupled to the recording layer of the memory element through a middle second electrode and a VIA and a digital line is coupled to a voltage gate which is insulated from the recording layer by a dielectric layer and is used to adjust the switching write current. The fabrication includes formation of bottom digital line, formation of memory cell & VIA connection, formation of top bit line. Dual photolithography patterning and hard mask etch are used to form a small memory pillar. Ion implantation is used to convert a buried dielectric VIA into an electrical conducting path between middle memory cell and underneath CMOS device.

27 Claims, 12 Drawing Sheets

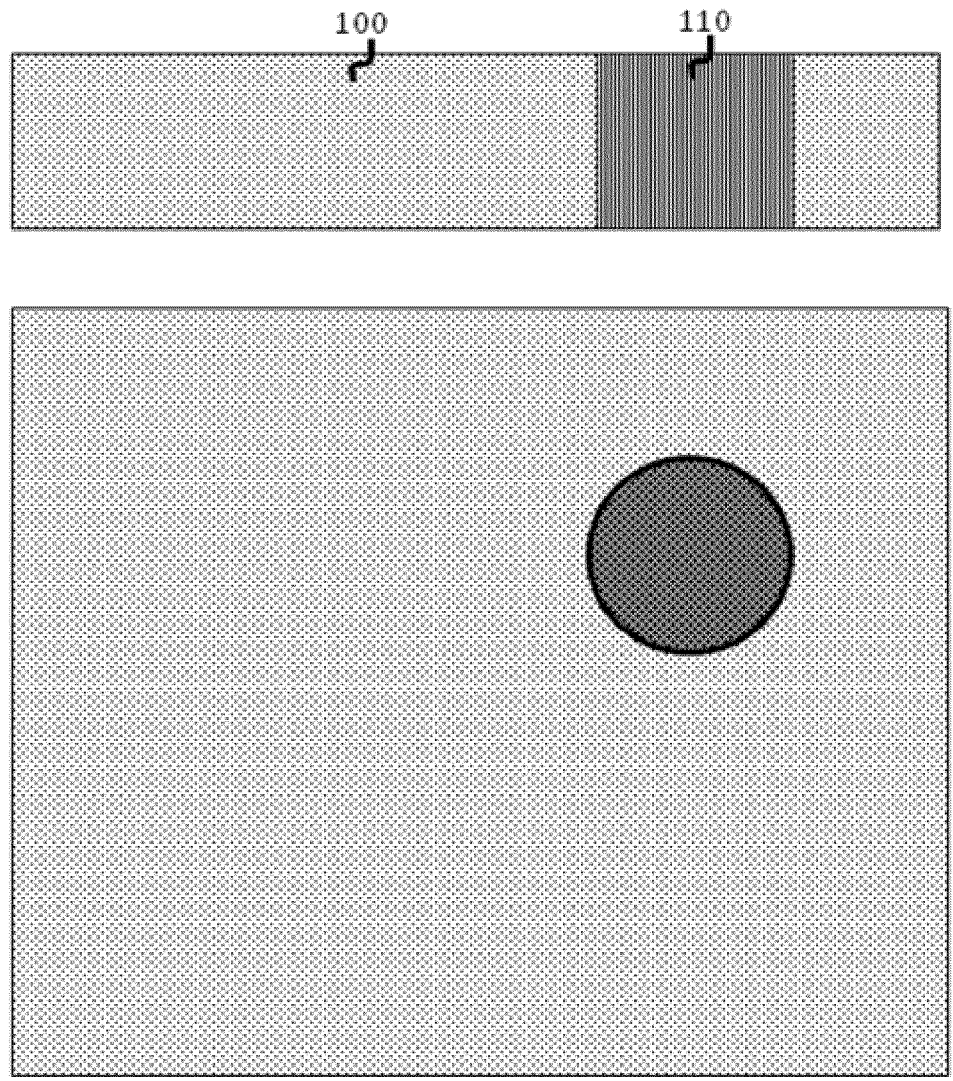
Fig. 3A(top) and 3B(bottom)
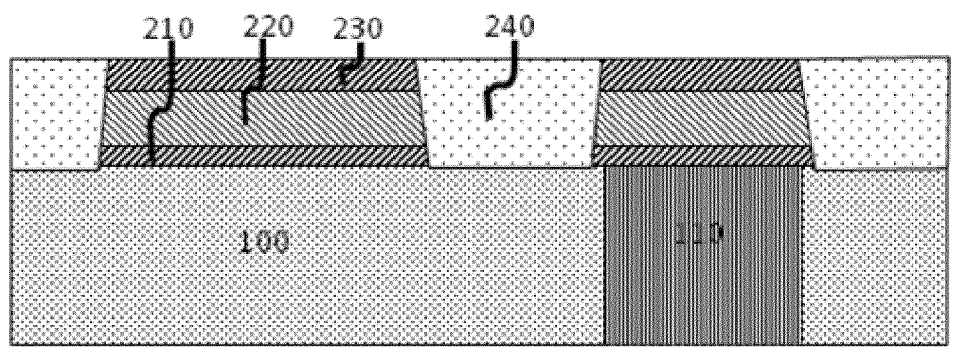
Fig. 4

Fig. 6A(top) and 6B(bottom)

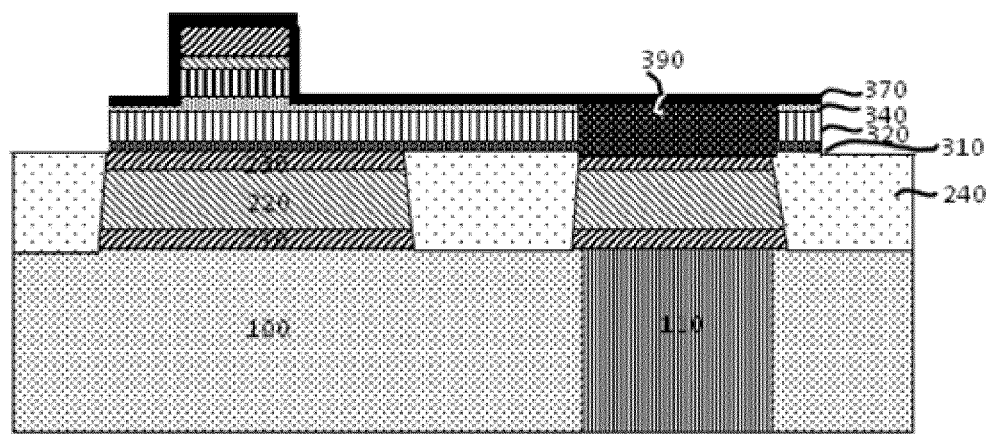
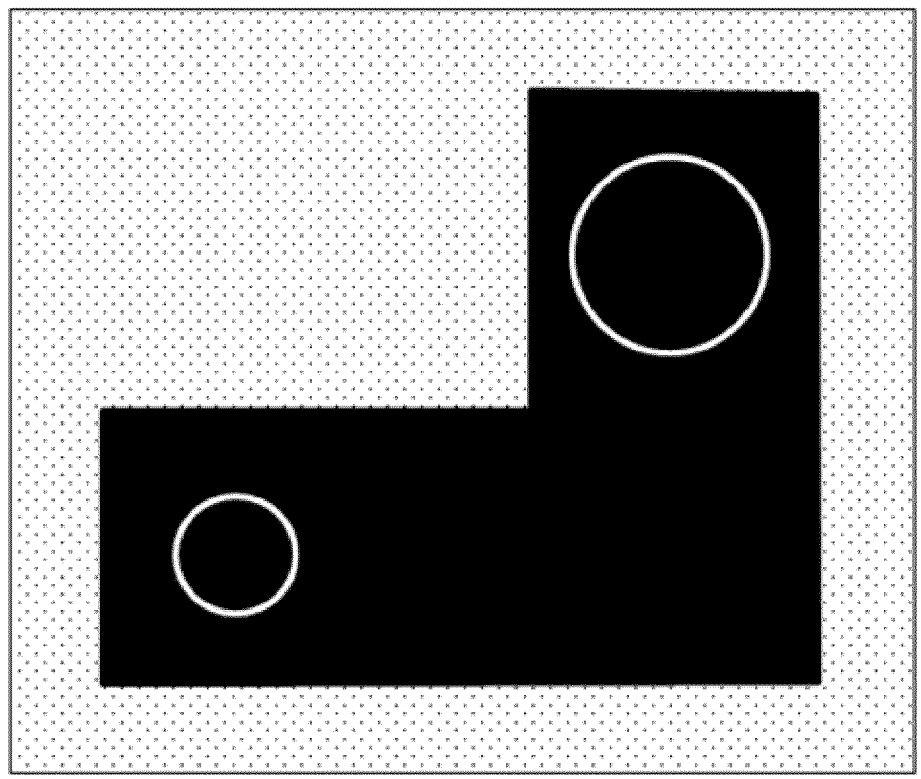
Fig. 9A (top) and 9B (bottom)

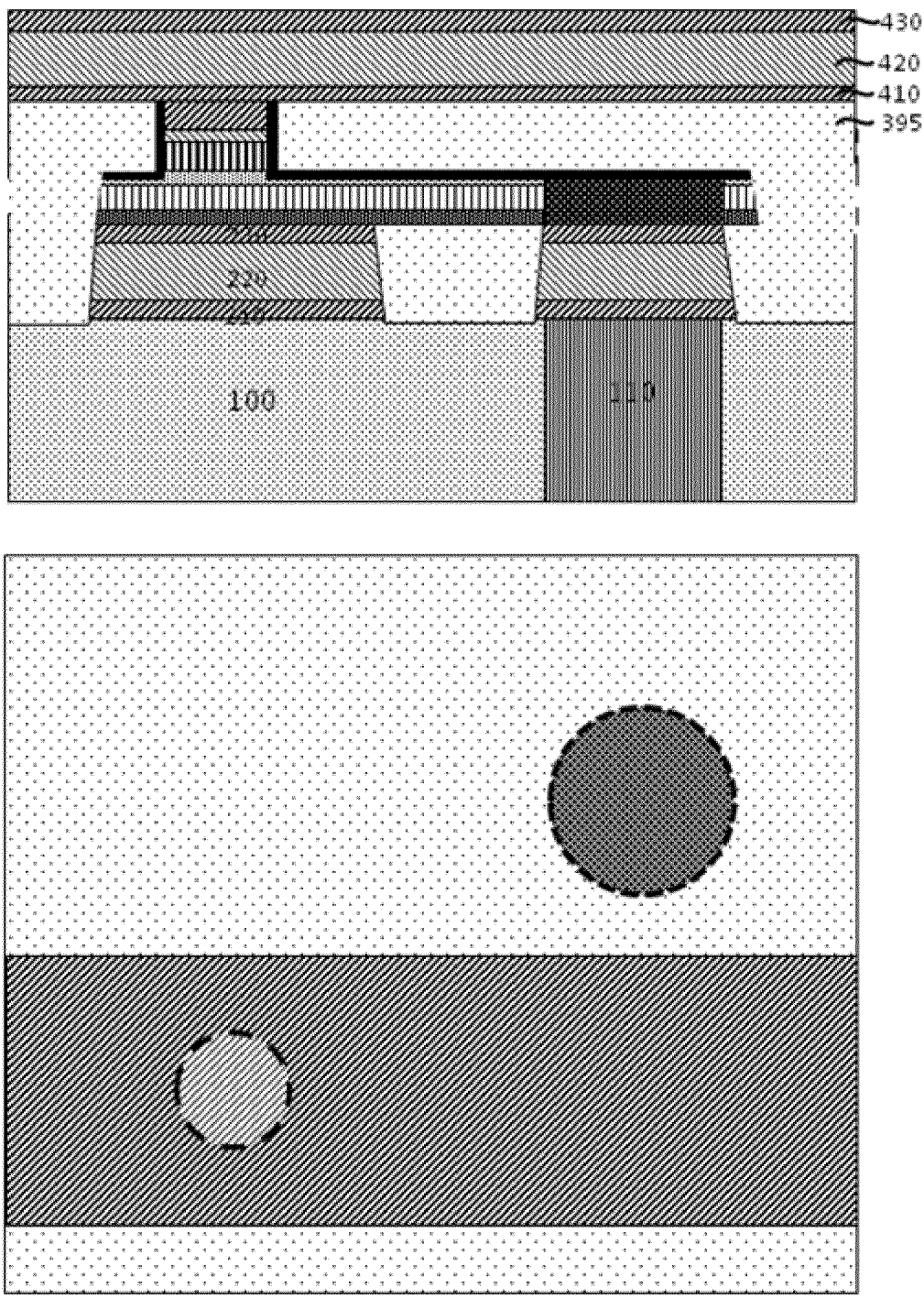
Fig. 17A (top) and B (bottom)

SELF-ALIGNED PROCESS FOR FABRICATING VOLTAGE-GATED MRAM

RELATED APPLICATIONS

This application claims the priority benefit of U.S. Provisional Application No. 61/768,743, filed on Feb. 25, 2013, which is incorporated herein by reference

BACKGROUND OF THE INVENTION

1. Field of the Invention

This invention relates generally to a voltage gated magnetic-random-access memory (VG-MRAM) cell, more particularly to methods of fabricating voltage-gated MRAM memory elements utilizing self-aligned process.

2. Description of the Related Art

In recent years, magnetic random access memories (hereinafter referred to as MRAMs) using the magnetoresistive effect of ferromagnetic tunnel junctions (also called MTJs) have been drawing increasing attention as the next-generation solid-state nonvolatile memories that can also cope with high-speed reading and writing. A ferromagnetic tunnel junction has a three-layer stack structure formed by stacking a recording layer having a changeable magnetization direction, an insulating tunnel barrier layer, and a fixed layer that is located on the opposite side from the recording layer and maintains a predetermined magnetization direction. Corresponding to the parallel and anti-parallel magnetic states between the recording layer magnetization and the reference layer magnetization, the magnetic memory element has low and high electrical resistance states, respectively. Accordingly, a detection of the resistance allows a magnetoresistive element to provide information stored in the magnetic memory device.

There has been a known technique for achieving a high MR ratio by forming a crystallization acceleration film that accelerates crystallization and is in contact with an interfacial magnetic film having an amorphous structure. As the crystallization acceleration film is formed, crystallization is accelerated from the tunnel barrier layer side, and the interfaces with the tunnel barrier layer and the interfacial magnetic film are matched to each other. By using this technique, a high MR ratio can be achieved.

Typically, MRAM devices are classified by different write methods. A traditional MRAM is a magnetic field-switched MRAM utilizing electric line currents to generate magnetic fields and switch the magnetization direction of the recording layer in a magnetoresistive element at their cross-point location during the programming write. A spin-transfer torque (or STT)-MRAM has a different write method utilizing electrons' spin momentum transfer. Specifically, the angular momentum of the spin-polarized electrons is transmitted to the electrons in the magnetic material serving as the magnetic recording layer. According to this method, the magnetization direction of a recording layer is reversed by applying a spin-polarized current to the magnetoresistive element. As the volume of the magnetic layer forming the recording layer is smaller, the injected spin-polarized current to write or switch can be also smaller.

Besides a write current, the stability of the magnetic orientation in a MRAM cell as another critical parameter has to be kept high enough for a good data retention, and is typically characterized by the so-called thermal factor which is proportional to the energy barrier as well as the volume of the recording layer cell size.

To record information or change resistance state, typically a recording current is provided by its CMOS transistor to flow in the stacked direction of the magnetoresistive element, which is hereinafter referred to as a "vertical spin-transfer method." Generally, constant-voltage recording is performed when recording is performed in a memory device accompanied by a resistance change. In a STT-MRAM, the majority of the applied voltage is acting on a thin oxide layer (tunnel barrier layer) which is about 10 angstroms thick, and, if an excessive voltage is applied, the tunnel barrier breaks down. More, even when the tunnel barrier does not immediately break down, if recording operations are repeated, the element may still become nonfunctional such that the resistance value changes (decreases) and information readout errors increase, making the element un-recordable. Furthermore, recording is not performed unless a sufficient voltage or sufficient spin current is applied. Accordingly, problems with insufficient recording arise before possible tunnel barrier breaks down.

In the mean time, since the switching current requirements reduce with decreasing MTJ element dimensions, STT-MRAM has the potential to scale nicely at even the most advanced technology nodes. However, patterning of small MTJ element leads to increasing variability in MTJ resistance and sustaining relatively high switching current or recording voltage variation in a STT-MRAM.

Reading STT MRAM involves applying a voltage to the MTJ stack to discover whether the MTJ element states at high resistance or low. However, a relatively high voltage needs to be applied to the MTJ to correctly determine whether its resistance is high or low, and the current passed at this voltage leaves little difference between the read-voltage and the write-voltage. Any fluctuation in the electrical characteristics of individual MTJs at advanced technology nodes could cause what was intended as a read-current, to have the effect of a write-current, thus reversing the direction of magnetization of the recording layer in MTJ.

Above issues or problems are all associated with the traditional two-terminal MRAM configuration. Thus, it is desirable to provide STT-MRAM structures and methods that realize highly-accurate reading, highly-reliable recording and low power consumption while suppressing destruction and reduction of life of MTJ memory device due to recording in a nonvolatile memory that performs recording resistance changes, and maintaining a high thermal factor for a good data retention.

BRIEF SUMMARY OF THE PRESENT INVENTION

The present invention comprises a magnetoresistive memory element having a gated voltage electric field assisted magnetization switching of a recording layer for a low power spin-transfer-torque MRAM with a large operating margin. The magnetoresistive element in the invention has three terminals: an upper electrode connected to a bit line, a middle electrode connected to a select transistor and a digital line as a bottom electrode wherein an MTJ stack is sandwiched between an upper electrode and a middle electrode, a dielectric functional layer is sandwiched between a middle electrode and a digital line of each MRAM memory cell, which also comprises a write circuit which supplies a voltage drop or electric field on a functional layer and bi-directionally supplies a spin polarized current to the MTJ stack.

An exemplary embodiment includes method of fabricating a spin-transfer-torque magnetoresistive memory cell utilizing self-aligned process. The memory cell further includes a circuitry coupled to the bit line positioned adjacent to selected ones of the plurality of magnetoresistive memory elements to supply a reading current or bi-directional spin-transfer recording current, and coupled to the digital line configured to generate an electric field on the functional layer and accordingly to decrease the switching energy barrier of the recording layer. Thus magnetization of a recording layer can be readily switched or reversed to the direction in accordance with a direction of a current across the MTJ stack by applying a low spin transfer current.

The exemplary embodiment will be described hereinafter with reference to the accompanying drawings. The drawings are schematic or conceptual, and the relationships between the thickness and width of portions, the proportional coefficients of sizes among portions, etc., are not necessarily the same as the actual values thereof.

BRIEF DESCRIPTION OF THE DRAWINGS

FIG. 3(A, B) are cross section view and top view of a substrate, respectively, with CMOS built-in (not shown) and VIA to connect to the top magnetic memory cell to be built;

FIG. 4 illustrates a digital line formed on the substrate;

FIG. 9(A, B) are cross section view and top view of the film structure, respectively, after photolithographic patterning and etching to separate adjacent cells and to form electric path between middle memory cell and the underneath CMOS through VIA;

FIG. 17 (A, B) area cross section view and top view of the formed memory structure, respectively, after a top bit line is formed by film deposition, photolithography patterning, etch, SiO2 refill and CMP;

DETAILED DESCRIPTION OF THE INVENTION

Figure 1:
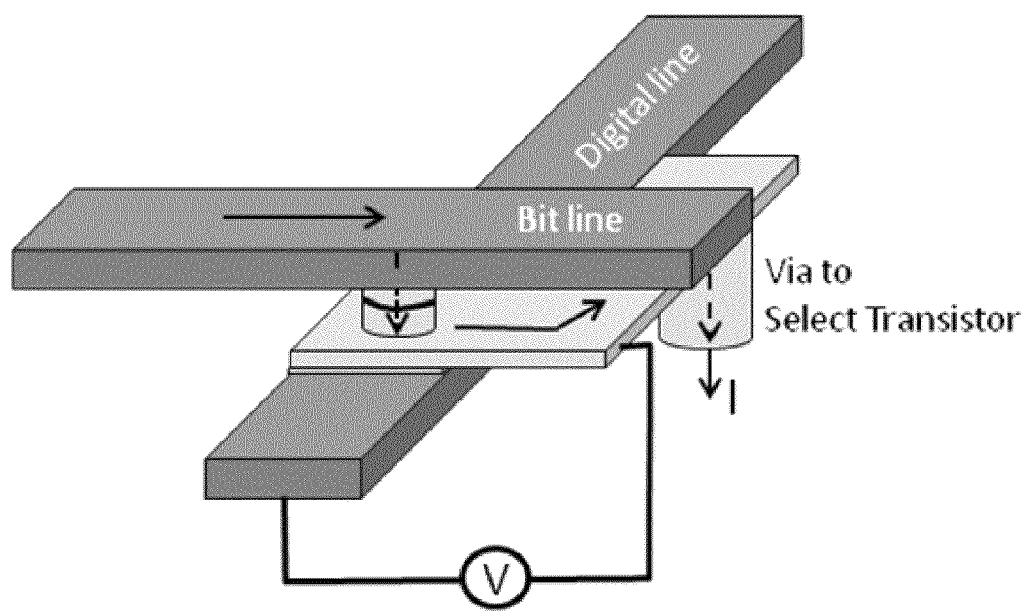
FIG. 1 illustrates a schematic drawing of three-terminal spin transistor memory.

In general, according to each embodiment, there is provided a perpendicular magnetoresistive memory cell comprising:

a digital line provided on a surface of a substrate serving as a bottom electrode;

a dielectric functional layer provided on the top surface of the digital line layer;

a recording layer provided on the top surface of the dielectric functional layer having magnetic anisotropy in a direction perpendicular to a film surface and having a variable magnetization direction;

a tunnel barrier layer provided on the top surface of the recording layer;

a reference layer provided on the top surface of the tunnel barrier layer having magnetic anisotropy in a direction perpendicular to a film surface and having an invariable magnetization direction;

a cap layer provided on the top surface of the reference layer as an upper electric electrode;

a middle electrode provided on sides of the recording layer and electrically connected to the recording layer;

a bit line provided on the top surface of the cap layer;

a CMOS transistor coupled the plurality of magnetoresistive memory elements through the middle electrode.

There is further provided circuitry connected to the bit line, the digital line and the select transistor of each magnetoresistive memory cell.

A dielectric functional layer is made of a metal oxide (or nitride, chloride) layer having a naturally stable rocksalt crystal structure having the (100) plane parallel to the substrate plane and with lattice parameter along its {110} direction being larger than the bcc (body-centered cubic)-phase Co lattice parameter along {100} direction. As an amorphous ferromagnetic material, like CoFeB, in the recording layer is thermally annealed, a crystallization process occurs to form bcc CoFe grains having epitaxial growth with (100) plane parallel to surface of the rocksalt crystal functional layer.

In a rocksalt crystal structure of a functional layer, such as MgO, two fcc sublattices for metal atoms and O atoms, each displaced with respect to the other by half lattice parameter along the [100] direction. However, at a surface, O atoms protrude while metal atoms retreat slightly from the surface, forming a strong interface interaction with the bcc CoFe grains. Accordingly, a perpendicular anisotropy and a perpendicular magnetization are induced in the recording layer, as a result of the strong interface interaction between the recording layer and the functional layer.

Further, as an electric field is applied on the functional layer and perpendicular to the surface, the negative charged O atoms and positive charged metal atoms at surface are pulled toward opposite directions and modify the interface interaction between the bcc CoFe grains in the soft adjacent layer and the rocksalt crystal grains in the functional layer. When an electric field points down towards the top surface of a functional layer, O atoms protrude more from the surface and form a stronger interface interaction with the bcc CoFe grains, causing an enhanced perpendicular anisotropy, and vice versa. This mechanism is utilized hereafter to manipulate the perpendicular anisotropy strength and magnetization direction of the recording layer through applying an electric field on the dielectric functional layer.

An exemplary embodiment includes method of fabricating a spin-transfer-torque magnetoresistive memory including a circuitry coupled to the bit line positioned adjacent to selected ones of the plurality of magnetoresistive memory elements to supply a reading current or bi-directional spin-transfer recording current, and coupled to the digital line configured to generate an electric field on the functional layer and accordingly to manipulate the perpendicular anisotropy strength of the recording layer. Thus magnetization of a recording layer can be readily switched or reversed to the direction in accordance with a direction of a current across the MTJ stack by applying a low spin transfer current.

The following detailed descriptions are merely illustrative in nature and are not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

FIG. 1 is a schematic view of a three-terminal voltage-gated magnetoresistive memory cell comprising a digital line at the bottom, a bit line at the top and a magnetic tunneling junction stack in the middle. The MTJ stack consists of a cap layer, a fixed reference layer, a tunnel barrier layer, a middle memory or recording layer and a bottom insulating functional layer, in an order from top to bottom. The middle memory layer is connected to a middle electrode and further connected to a select CMOS transistor (not shown here) through a VIA. The MTJ stack is a perpendicular MTJ or a planar MTJ. In another word, both the reference layer and the recording layer have perpendicular anisotropies and magnetizations or planar anisotropy and magnetizations. The top reference layer has a fixed magnetization due to its strong anisotropy; while the anisotropy of the middle memory layer can be either perpendicular to the film plane or in the plane depending on the voltage applied on the functional layer between the top and bottom electrode. Both read and write current flow through the top reference layer, the tunnel barrier layer, the middle memory film stack and VIA to or from the underneath CMOS control circuit (not shown here). The write current can be greatly reduced by a voltage applied between the top and bottom electrode.

Figure 2:
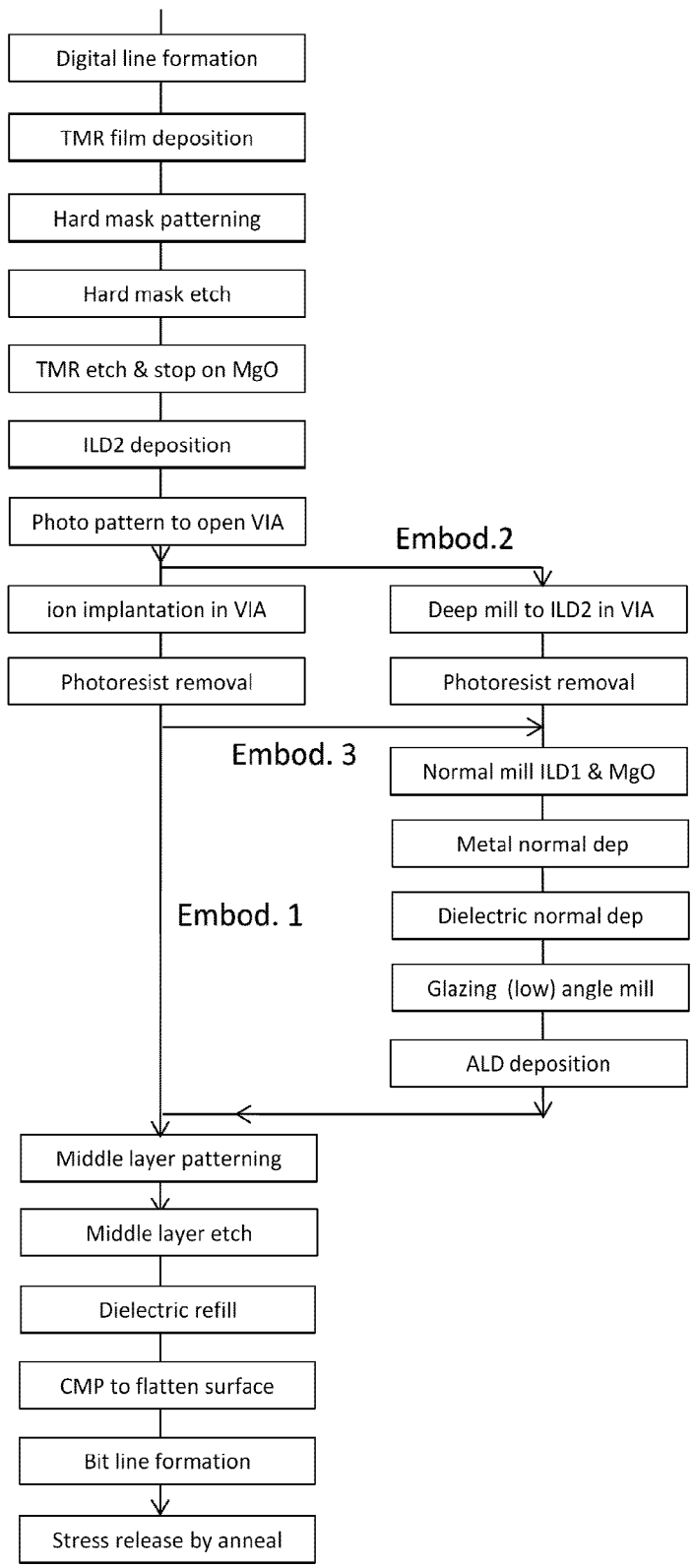
FIG. 2 is a process flow to make three-terminal memory cell having a voltage-gate.

Several process options can BE used to form such a three-terminal memory device, as shown in the process flow chart in FIG. 2. The fabrication starts from a substrate 100 as shown in FIG. 3(A, B) containing a VIA 110 which is connected to the underneath CMOS circuits which are previously built (not shown here). First, the bottom digital line film is deposited. An example of a typical film stack is Ta/Ru/Ta multilayer in which a first Ta layer 210 is 10-30 nm, a Ru layer 220 is 20-50 nm and a second Ta layer 230 is 10-40 nm, or Ta/NiFe/Ru/NiFe(optional)/Ta. After the deposition, a photolithography patterning and a reactive ion etch (RIE) process are used to form the digital line, followed by a refill of a dielectric layer (such as $SiO_2$) 240 and a chemical mechanical polishing (CMP) to flatten the surface, as shown in FIG. 4.

Figure 5:
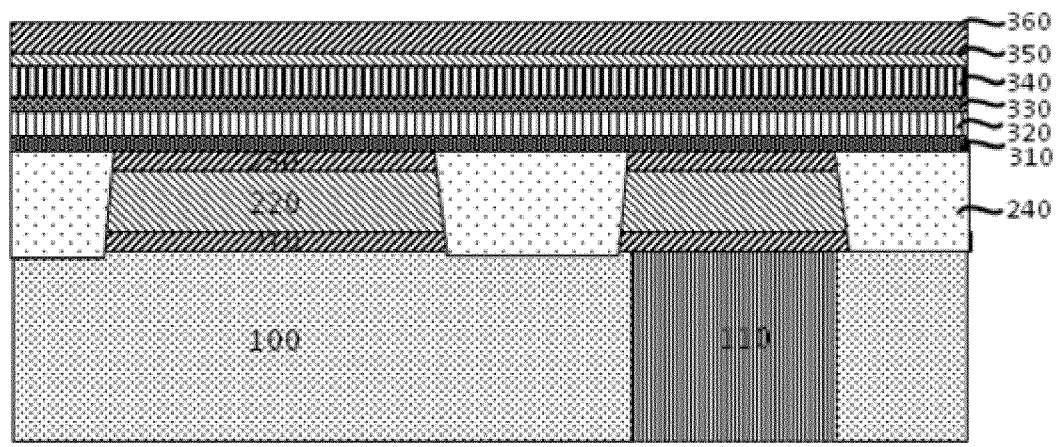
FIG. 5 shows a TMR film stack deposited on top of digital line surface.

Then a TMR film stack is deposited, as shown in FIG. 5. An example of the TMR film stack is ILD1/ML1/MgO/ML2/Ru/Ta where a dielectric functional layer ILD1 310 is either a single MgO layer with a thickness of about 2.5 nm, or a bilayer of AlOx (1 nm)/MgO (2 nm). The MgO tunneling barrier layer 330 has a thickness of ~1 nm. The magnetic recording or memory layer ML1 320 is either CoFeB or bi-layer of CoFeB/CoFe, and the magnetic reference layer ML2 340 has a fixed magnetization. A typical multilayer structure used for ML2 is CoFeB/TbCoFe, CoFeB/CoPd, CoFeB/CoPt, or CoFeB/(Co/Pt)n, CoFeB/(Co/Pd)n. The Ru cap layer 350 with a thickness of 1-2 nm is used to separate the ML2 from the Ta hard mask 360 which has typical thickness of 10-40 nm.

Figure 6:
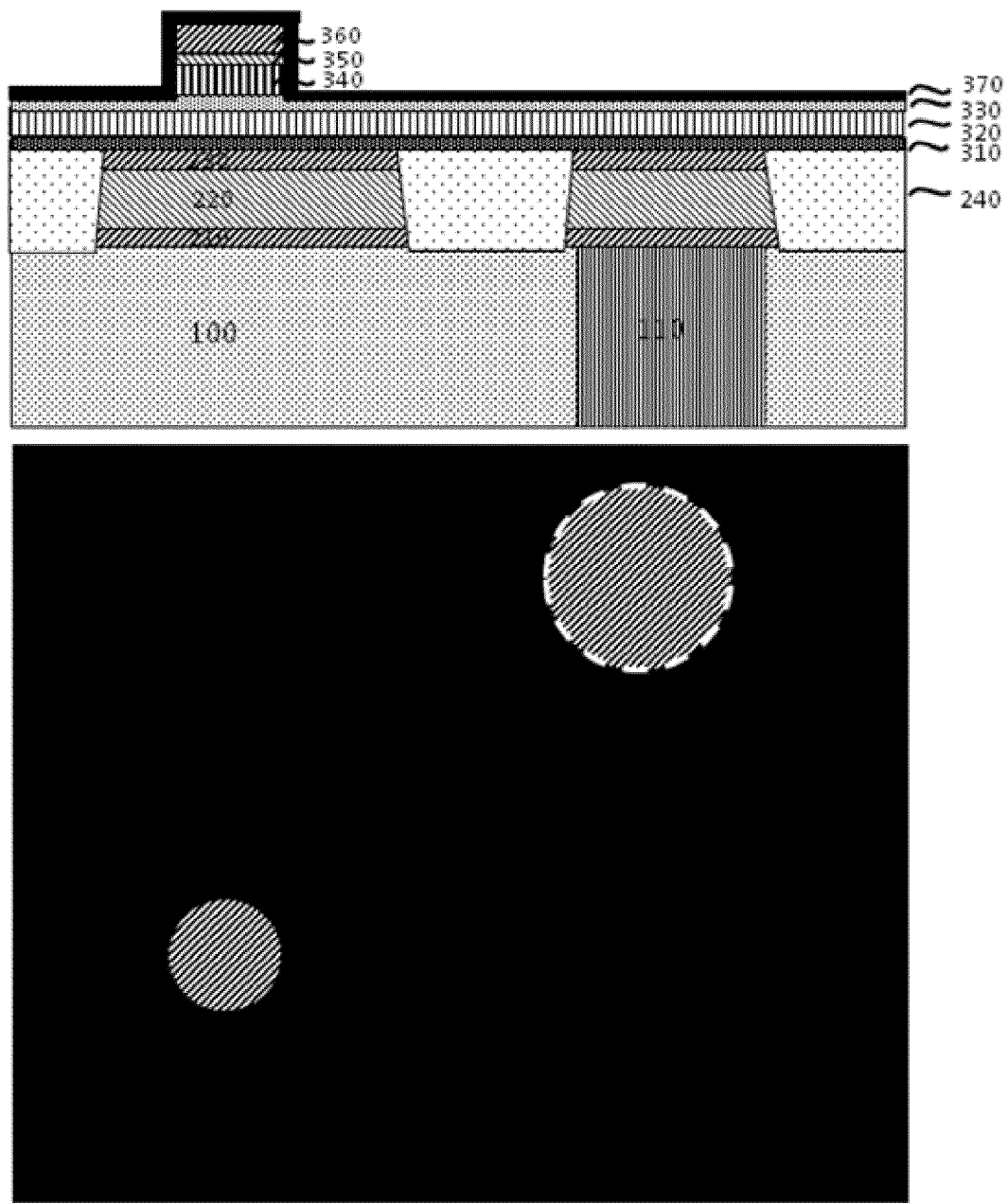
FIG. 6(A, B) are cross section view and top view of a conformal insulating layer (ILD2) deposited to cover the surface and the MTJ edge of the memory cell, respectively.

A photolithography patterning and an etching process are then conducted to form a small Ta hard mask pillar using a CF4 chemical gas followed by an oxygen ashing removal of the remaining PR and RIE re-dep. After the Ta hard mask pillar is formed, a chemical gas of CH3OH or a mixed gas of CO and NH4 is used to etch the top Ru layer 350 and the reference layer 340 and stop on the top MgO tunnel barrier layer 330. Immediately after the etching, an insulating layer ILD2 370 is deposited to form a conformal layer covering the exposed MTJ edge and the entire surface, as shown in FIG. 6 (A cross section, B top view). The ILD2 layer 370 can be a single layer of AlOx (6 nm), a bi-layer of MgO (2 nm)/AlOx (5 nm) or SiN (2 nm)/AlOx (5 nm). The AlOx layer can be deposited by a so-called atomic layer deposition (ALD) and a thin SiN layer can be deposited by PECVD which is good for end-point detection during later milling.

Due to the presence of the ILD1 layer 310 underneath the middle magnetic memory layer 320, the top metal surface of VIA is electrically isolated from the bottom CMOS circuit. In order to connect the middle memory layer to the underneath CMOS device, the ILD1 layer in the VIA area must be either removed or changed to be conductive. For this purpose, a photolithography patterning is used to open the VIA area. Hereafter three different process schemes to make the VIA conductive are described in detail.

First Embodiment

Figure 7:
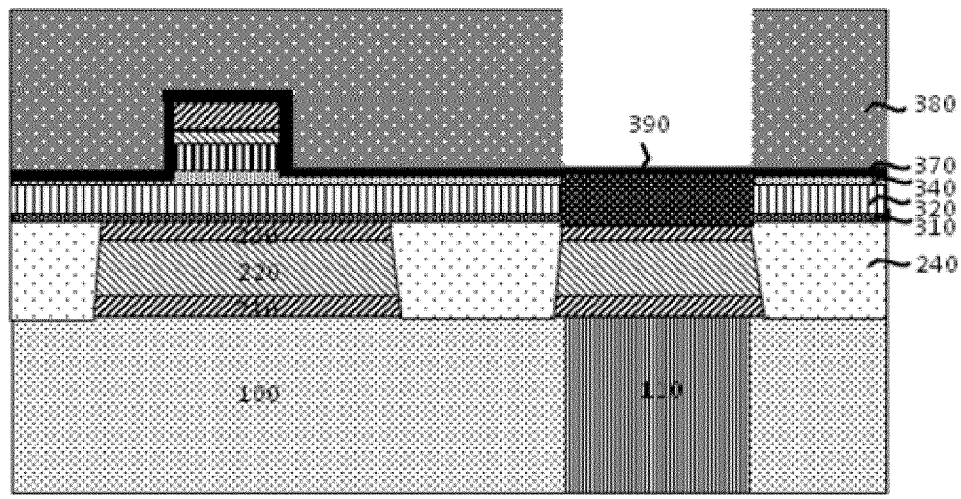
FIG. 7 illustrates a photolithographic patterning to open the VIA and metallic ion implantation in the exposed VIA into the buried ILD1 and magnetic memory layers below ILD2 layer.

In a first method, a photolithography patterning is used to open the VIA, Then using the patterned photoresist as a mask, a metal (typically, Li, Cu, Au, Pt) ion implantation is used to add highly conductive metallic atoms deep into the buried ILD1 layer 310 to convert it into an electrically conducting layer (FIG. 7).

Figure 8:
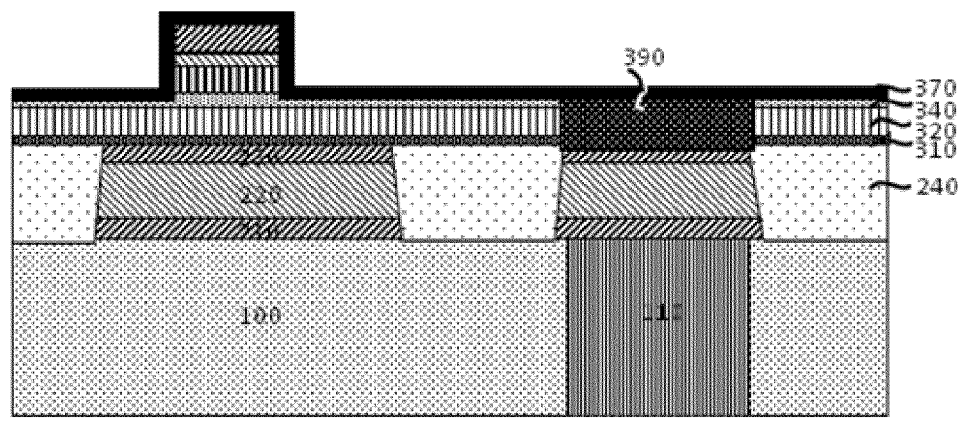
FIG. 8 shows cross section view of the patterned structure after photoresist liftoff.
Figure 10:
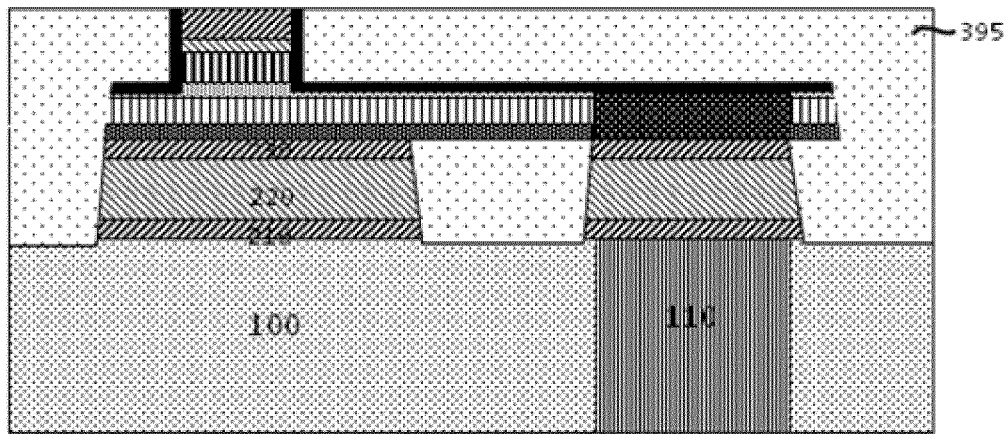
FIG. 10 shows the structure after SiO2 filling the entire surface and a subsequent CMP process to flatten the whole surface.

After ion implantation, the photoresist is removed, as shown in FIG. 8. Another photolithography patterning and etching process is used to electrically separate adjacent magnetoresistive cells and leave a conducting path between the middle memory cell and the VIA (FIG. 9, A—cross section, B—top view), followed by a refilling of a dielectric (typically SiO2) layer 395 and a CMP process to flatten the device surface, as shown in FIG. 10.

Second Embodiment

Figure 11:
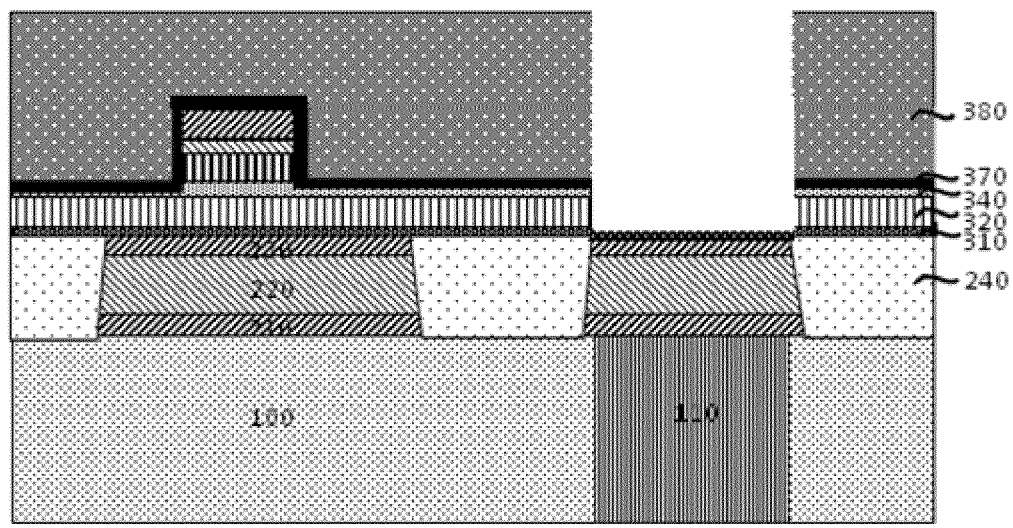
FIG. 11 illustrates an alternative fabrication process as a second embodiment, in which the VIA material is completely milled away.
Figure 12:
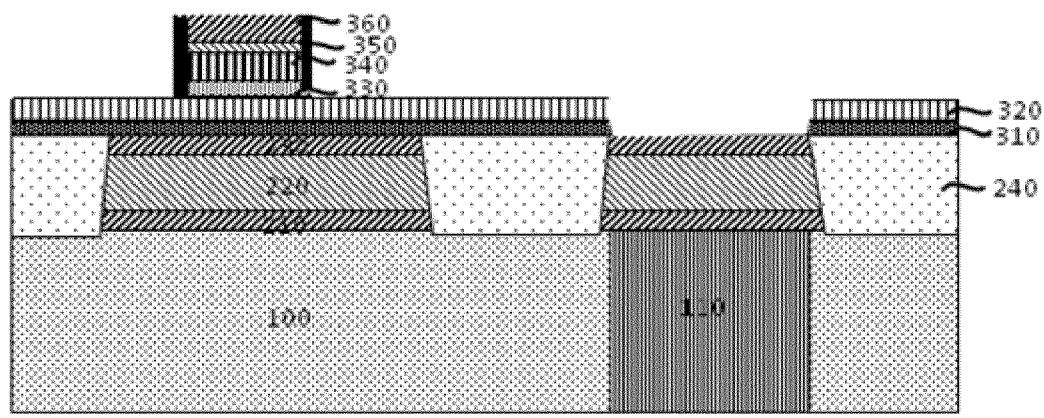
FIG. 12 shows a vertical sputter etch after photoresist removal to remove the top ILD1 and MgO barrier from the surface.
Figure 13:
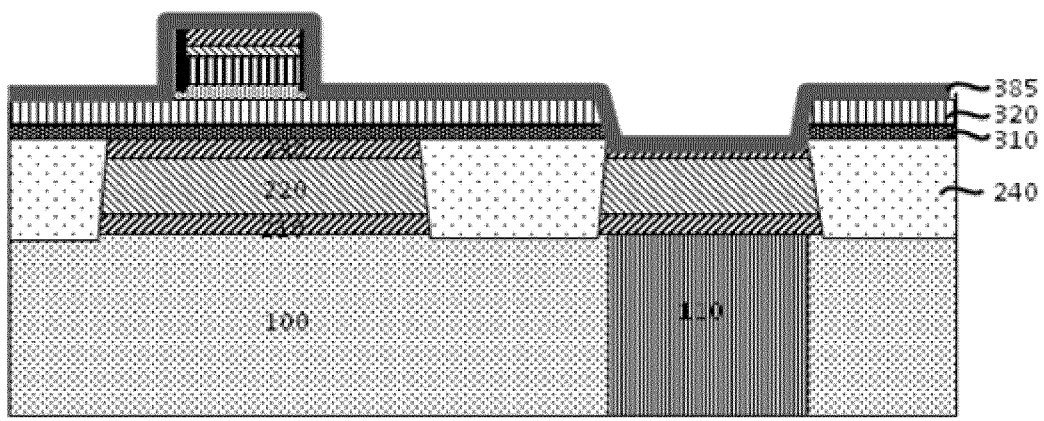
FIG. 13 shows that a metallic conducting layer is uniformly deposited in contact with the middle memory layer outside the memory pillar and in the VIA region.

Following the photolithography patterning of VIA as described in the first embodiment, a deep etch by using low angle ion mill is used to remove all the materials (ILD1, MgO, middle memory and ILD2) from the VIA, as shown in FIG. 11. After removing the remaining photoresist, a low-angle normal (perpendicular) ion milling is used to remove the ILD1 and MgO across the wafer flat surface while keeping the vertical surfaces near MTJ junction of the memory pillar still partially covered by the remaining ILD2 layer, as shown in FIG. 12. Then a metal layer (typically Ru, Cu, Cu and Al alloy) is deposited over the entire surface including the etched VIA area, as shown in FIG. 13, which later on acts an electrical conducting path between the middle memory layer and the VIA to the underneath CMOS.

Third Embodiment

Figure 14:
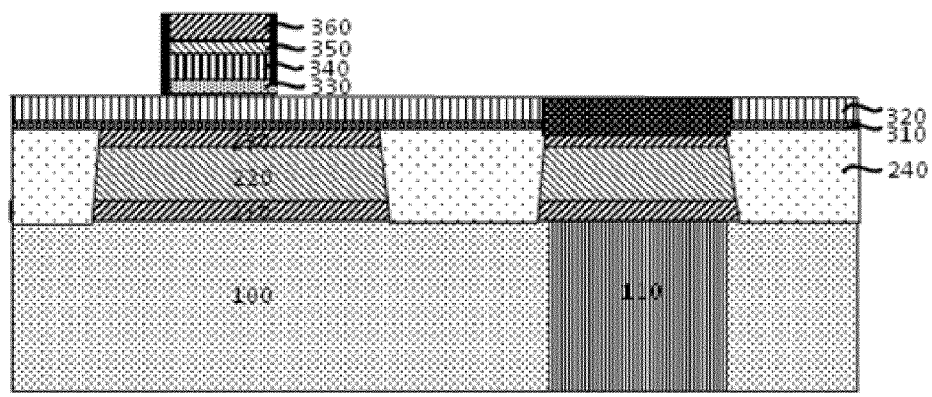
FIG. 14 shows that a vertical sputter etch is conducted to remove the top ILD2 and MgO layers from the flat surface including VIA while vertical MTJ edge is still protected.

Continuing from embodiment one (see FIG. 8) a normal (perpendicular) ion milling is used to remove the ILD2 and MgO barrier layers from the flat surface while keeping the vertical surface where the memory pillar located still covered by a portion of ILD2, as shown in FIG. 14. Then a metal layer 385 (typically Ru, Cu, Cu and Al alloy) is normally deposited over the entire device surface, as shown in FIG. 15 for the purpose of electrical conducting enhancement between the middle memory layer and VIA to the underneath CMOS.

Figure 15:
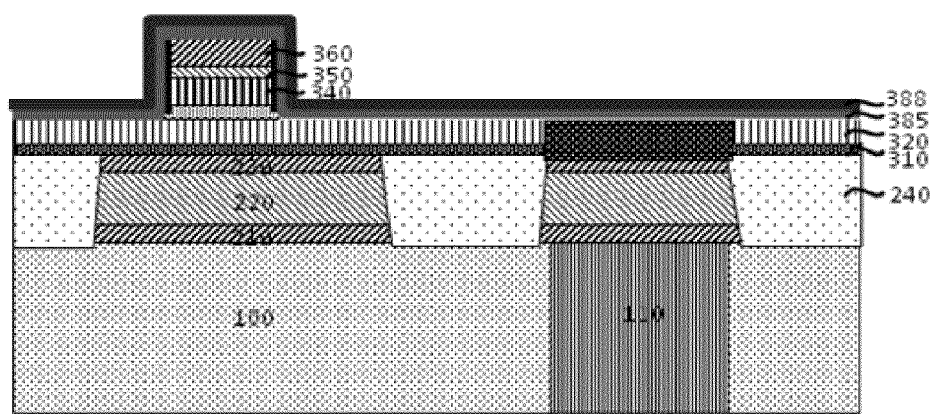
FIG. 15 shows a metallic conducting layer is deposited in contact with the middle memory layer outside the memory pillar and VIA top surface, then a thin dielectric layer is added to cover the metal layer.
Figure 16:
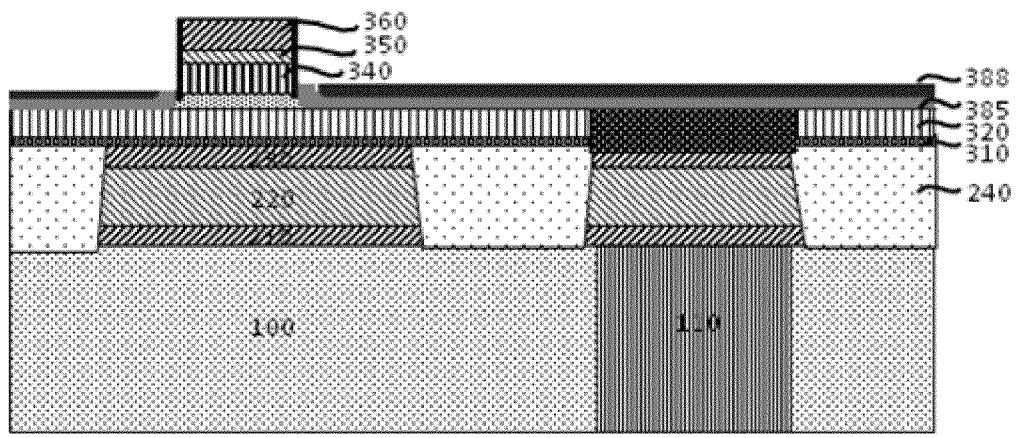
FIG. 16 shows that the dielectric layer and the metal layer near the vertical MTJ edge is removed by a glazing angle milling process while the flat surface is protected by the dielectric layer.

For the second and third embodiments, after a metal layer 385 deposition, a thin dielectric layer 388, such as SiO2, Si3N4 or Al2O3, is deposited to cover the top metal surface (as shown in FIG. 15), and a glazing (large) angle mill is used to remove the metal layer from the vertical surfaces near the MTJ junction on the memory pillar to prevent shorting, as shown in FIG. 16.

Similar to embodiment one, a photolithography patterning and etch is used to create a conducting path between the middle memory cell and the VIA (similar to FIG. 9), and a refilling of a thick dielectric layer 390 (SiO2) is used to fill the entire device surface and a CMP to flatten the device surface (similar to FIG. 10).

Finally, for all three embodiments, a top bit line is formed by thin film deposition (Ta/Ru/Ta or Ta/NiFe/Ru/NiFe(optional)/Ta), photo patterning, etch, dielectric refill and CMP (as shown in FIG. 17).

To release process-induced stress and repair material damage by ion implantation, a high temperature bake is used.

While certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A spin-transfer torque magnetoresistive memory comprising a control circuitry and at least one memory cell comprising:
   a digital line provided on a surface of a substrate serving as a bottom electrode;
   a dielectric functional layer provided on the top surface of the digital line layer;
   a recording layer provided on the top surface of the dielectric functional layer having a magnetic anisotropy and a variable magnetization direction and having an induced perpendicular anisotropy from a interface interaction with the functional layer;
   a tunnel barrier layer provided on the top surface of the recording layer;
   a reference layer provided on the top surface of the tunnel barrier having magnetic anisotropy and having a fixed magnetization direction;
   a cap layer provided on the top surface of the reference layer as an upper electric electrode;
   a middle electrode provided on sides of the recording layer and electrically connected to the recording layer;
   a bit line provided on the top surface of the cap layer;
   a select CMOS transistor coupled the middle electrode of magnetoresistive memory elements through a conductive VIA;
   The control circuitry coupled through the bit line, the digital line and the select transistor to selected ones of the plurality of magnetoresistive memory elements,
   The control circuitry further configured to provide a bi-directional spin-transfer recording current between the bit line and the select transistor and to provide a voltage on the digital line to generate an electric field on the dielectric functional layer to manipulate the induced perpendicular anisotropy in the recording layer in a recording operation,
   The control circuitry further configured to provide a reading current between the bit line and the select transistor in a reading operation.

2. A method of manufacturing a magnetoresistive memory cell comprising
   a digital line provided on a surface of a substrate serving as a bottom electrode;
   a dielectric functional layer provided on the top surface of the digital line layer;
   a recording layer provided on the top surface of the dielectric functional layer having a magnetic anisotropy and a variable magnetization direction and having a induced perpendicular anisotropy from a interface interaction with the functional layer;
   a tunnel barrier layer provided on the top surface of the recording layer;
   a reference layer provided on the top surface of the tunnel barrier having magnetic anisotropy and having a fixed magnetization direction;
   a cap layer provided on the top surface of the reference layer as an upper electric electrode;
   a conductive VIA electrically connected to a select CMOS transistor;
   a middle electrode provided on sides of the recording layer and electrically connected to the recording layer and the VIA;
   a bit line provided on the top surface of the cap layer;
   and comprising a self-aligned patterning process to make the middle electrode electrically connected to the recording layer and the VIA;
   and said recording layer is modulated by the voltage between said digital line and said middle electrode, which could be perpendicular to the plane or lie in the plane.

3. The element of claim 2, wherein the formation of said digital line begins with film stack deposition, photolithography patterning, RIE etch, dielectric refill and CMP to flatten the surface.

4. The element of claim 2, wherein said digital line comprises a film stack of Ta/X/Ta, or Ta/NiFe/X/NiFe(optional)/Ta with X being Ru, Cu, Ag, Al, Au, or an alloy of them, having a bottom Ta thickness between 1-3 nm and top Ta thickness between 10-40 nm, X thickness between 10-50 nm and NiFe thickness between 2-6 nm.

5. The element of claim 2, wherein a memory film stack consisting of said dielectric functional layer, said recording layer, said tunnel barrier layer, said reference layer, said cap layer and a hard mask layer is deposited on top of said digital line.

6. The element of claim 2, wherein said dielectric function layer, having a thickness between 1-3 nm, is a single layer Y made of metal oxide, or nitride, oxynitride, preferred to be selected from MgO, MgZnO, MgN, MgON, or a bi-layer Z/Y, Z is made of an oxide, or nitride, oxynitride, preferred to be AlOx or SiOx, having a thickness between 1-2 nm.

7. The element of claim 2, wherein said recording layer is a CoFeB layer having a thickness between 1-2 nm or a bi-layer CoFeB/CoFe having CoFe as an interface dusting layer having a thickness between 0.2-0.5 nm and immediately adjacent to said tunnel barrier layer.

8. The element of claim 2, wherein said reference layer is preferred to be CoFeB/TbCoFe, CoFeB/CoPt, CoFeB/CoPd, CoFeB/(Co/Pt)n, CoFeB/(Co/Pd)n having a thickness between 2-10 nm.

9. The element of claim 2, wherein said capping layer is preferred to be a Ru layer having a thickness between 1-2 nm, and said hard mask layer is preferred to be Ta, or Ta alloy having a thickness between 10-40 nm.

10. The element of claim 2, wherein said bit line has a film stack of Ta/X/Ta, or Ta/NiFe/X/NiFe(optional)/Ta with X being selected from Ru, Cu, Ag, Al, Au, or an alloy of them, having a bottom Ta thickness between 1-3 nm and top Ta thickness between 10-40 nm, X thickness between 40-80 nm and NiFe thickness between 2-10 nm.

11. The element of claim 2, further comprising a single or dual photo patterning and hard mask etching process to first create a Ta hard mask pillar array, and said hard mask etch comprising an RIE etch using a chemical gas CxFyHz, preferred to be CF4, CF3H, having an etch stop on Ru cap layer, and O2 or Ar/O2 ashing removal of the remaining photoresist and associated Ta re-dep.

12. The element of claim 2, further comprising a TMR etch process, preferred to be an RIE process using a mixed chemical gases CO and NH4 or a chemical gas CH3OH, C2H5OH, and stopping on the said tunnel barrier layer controlled by an end-point signal detection.

13. The element of claim 2, further comprising a conformal deposition of a thin dielectric layer on the etch-opened TMR junction, and the said thin dielectric covering layer is preferred to be made by atomic layer deposition (ALD) of a single AlOx layer, or a bi-layer of MgO/AlOx, SiN/AlOx, having an AlOx thickness of 4-8 nm, an MgO thickness of around 2 nm, a SiN thickness of around 2 nm.

14. The element of claim 2, further comprising a patterning process to open a VIA area on the conformal dielectric covering layer on device surface using a photoresist mask.

15. The element of claim 14, further comprising an ion implantation process conducted in the VIA areas using ion element is selected from Li, Cu, Al, Ag, Au, Ru, Pt with photoresist patterning acting as ion implantation mask.

16. The element of claim 14, further comprising a deep etch in the exposed VIA by ion mill to remove all the materials starting from top dielectric layer, MgO barrier layer, middle memory stack layer, and bottom dielectric function layer.

17. The element of claim 14, wherein said remaining photoresist is removed by O2 or Ar/O2 ashing after the ion implantation process or deep etching.

18. The element of claim 17, wherein a normal (perpendicular to the flat surface) sputter etching using low-angle ion milling to remove the dielectric covering layer and MgO barrier layer from the device surface.

19. The element of claim 18, further comprising a normal deposition of a conducting metal layer on the surface including the VIA open area by low-angle ion deposition or physical vapor deposition.

20. The element of claim 19, further comprising a normal deposition of a thin dielectric layer to cover the said conducting metal layer.

21. The element of claim 20, further comprising a glazing (large) angle ion mill to move the said metal layer near the vertical MTJ junction wall.

22. The element of claim 21, further comprising a photolithography patterning and etch process to create a conductive path between said TMR memory cell and said VIA.

23. The element of claim 22, further comprising a deposition of a thick dielectric layer, preferred to be SiN or SiOx, to cover the entire device surface, followed a CMP process to flatten the device surface and stop on Ta hard mask pillar.

24. The element of claim 2, wherein said bit line film stack is deposited to electrically contact to said Ta hard mask layer, and said bit line is photolighography patterned and etch by RIE.

25. The element of claim 24, wherein the etched bit line is refilled by a thick (100 nm) dielectric layer of SiO2 or SiN/SiOx, and the refilled surface is flattened by CMP using Ta as the stopping layer.

26. The element of claim 2 is further annealed at certain high temperature to repair the ion implantation damage and to release the process induced stress.

27. The element of claim 2, wherein the as-formed three-terminal memory has its current path flow between said bit line and VIA to the underneath select CMOS transistor and a voltage controlled gate between said middle electrode and said digital line.

* * * * *